United States Patent [19]

Hur et al.

[11] Patent Number: 5,492,885
[45] Date of Patent: Feb. 20, 1996

[54] MERCURY-THALLIUM-BARIUM-CALCIUM-STRONTIUM-COPPER-OXIDE 1223 SUPERCONDUCTOR AND METHOD OF MAKING SAME

[75] Inventors: Yong H. Hur; Yong K. Park; Jong C. Park, all of Daejeon, Rep. of Korea

[73] Assignee: Korea Research Institute of Standards and Science, Daejeon, Rep. of Korea

[21] Appl. No.: 291,454

[22] Filed: Aug. 17, 1994

[30] Foreign Application Priority Data

Apr. 25, 1994 [KR] Rep. of Korea ............... 94-8718

[51] Int. Cl.$^6$ ............ H01L 39/12; H01B 12/00; C04B 35/45; C04B 35/64
[52] U.S. Cl. ............ 505/120; 505/125; 505/126; 505/450; 505/501; 505/739; 505/783; 505/822; 505/785; 505/492; 505/742; 501/123; 252/521; 423/593
[58] Field of Search .................. 505/120, 125, 505/126, 450, 501, 739, 783, 822, 785, 492, 742; 501/123; 252/521; 423/593

[56] References Cited

U.S. PATENT DOCUMENTS

| | | | |
|---|---|---|---|
| 5,100,868 | 3/1992 | Snyder et al. | 505/737 X |
| 5,300,482 | 4/1994 | Doi et al. | 505/783 X |
| 5,332,721 | 7/1994 | Xin et al. | 505/783 X |

OTHER PUBLICATIONS

Gupta, Raju P., et al., "Mechanism of hole doping in Hg-based cuprate superconductors", *Physica C*, 223, Nos. 3 & 4 (10 Apr. 1994) 213–218.

Schilling et al., *Nature*, "Superconductivity above 130 K in the Hg–Ba–Ca–Cu–O system", May 6, 1993, pp. 56–57.

Chu et al., *Nature*, "Superconductivity above 150 K in . . . ", Sep. 23, 1993, pp. 323–325.

Paranthaman, M., *Physica C*, "Single-step synthesis of bulk . . . ", 1994, pp. 7–12.

Hur, Nam H., et al., "A New Mercury–Based Superconductor with a $T_c$ of 132 K", *Materials Research Bulletin*, 29(9) (Sep. 1994), 959–964.

Hur, Nam H., et al., "Synthesis and Characterization of a new mercury–based Superconductor", *Physica C*, 231 (1 & 2) (20 Sep. 1994), 4–8.

Goutenoire, F., et al., "Substitution of Mercury for Thallium in the 2223–Cuprate: The 130K–Superconductor", *Solid State Commun.*, 90(1) (Apr. 1994), 47–51.

*Primary Examiner*—Douglas J. McGinty
*Attorney, Agent, or Firm*—Cushman Darby & Cushman

[57] ABSTRACT

Mercury-thallium based superconductors with the formula $Hg_{1-x}Tl_xBa_2(Ca_{1-y}Sr_y)_2Cu_3O_{8+\delta}$; change "their preparing method, in particular characterized in that it" to and a method for preparing them. The new superconductors are prepared by reacting respective ternary oxides, such as $Ba_2CuO_{3+x}$ and $Ca_{1-y}Sr_yCuO_2$, to reduce the formation of an impure phase and by substituting thallium (Tl) a portion of the mercury (Hg) conventionally used in mercury-based superconductors of similar structure, in order to thermally stabilize the superconductor and provide it with a high critical current density characteristic.

2 Claims, 5 Drawing Sheets

MERCURY-THALLIUM-BARIUM-CALCIUM-STRONTIUM-COPPER-OXIDE 1223 SUPERCONDUCTOR AND METHOD OF MAKING SAME

BACKGROUND OF THE INVENTION

Superconductivity was first discovered from investigation of mercury (Hg) by H. Kamerlingh-Onnes in 1908. When a metal or alloy is cooled down below a certain temperature which is called its superconducting transition temperature (Tc), superconductivity is caused by extinction of electrical resistance. Such a superconducting phenomenon is not limited to a specific metal, but can be found in most of metals at a sufficiently low temperature, depending on the metal. For example, whereas the critical superconducting temperature of mercury is 4K, that of a certain alloy of tin and niobium is 18K.

As for superconducting material showing such a phenomenon, metal compounds were mainly used before Bednorz and Muller found superconductivity in $La_{2-x}Ba_xCuO_4$ in 1986. Since then, copper oxides have been mainly developed for superconductors having high Tc. After that, many kinds of copper-based superconductors have been synthesized at a higher critical temperature than the boiling point of liquid nitrogen (77K). This became a turning point in studying the application of superconductors. The representative examples are $YBa_2Cu_3O_7$, $Bi_2Sr_2Ca_{n-1}Cu_nO_{2n+4}$ and $Tl_2Ba_2Ca_{n-1}Cu_nO_{2n+4}$.

Recently, the mercury-based superconductor $HgBa_2Ca_2Cu_3O_8$ was developed by Schilling et al in 1993, which has the highest Tc of 133K among the existing superconductors. However, it is difficult to synthesize the mercury-based compounds due to evaporation of mercury during the preparing process. Furthermore, $HgBa_2Ca_2Cu_3O_8$ is very unstable in the air, and has low critical current density so that study of its application is limited. On the contrary, thallium-based $TlBa_2Ca_2Cu_3O_{8+\delta}$, which has similar structure to the mercury-based superconductors is relatively stable in air. However, it has a Tc of 115K which is much lower Tc than mercury-based superconductors.

SUMMARY OF THE INVENTION

The present invention relates to mercury-thallium based superconductors $Hg_{1-x}Tl_xBa_2(Ca_{1-y}Sr_y)_2Cu_3O_{8+\delta}$ and to a method for preparing them, in particular characterized in that the superconducting composition is prepared by reacting ternary oxides such as $Ba_2CuO_{3+x}$ and $Ca_{1-y}Sr_yCuO_2$ to prevent the formation of an impure phase, and by substituting thallium (Tl) for a portion of mercury (Hg) to thermally stabilize the superconductor and to provide it with a high critical current density characteristic.

DETAILED DESCRIPTION

Figure 1:
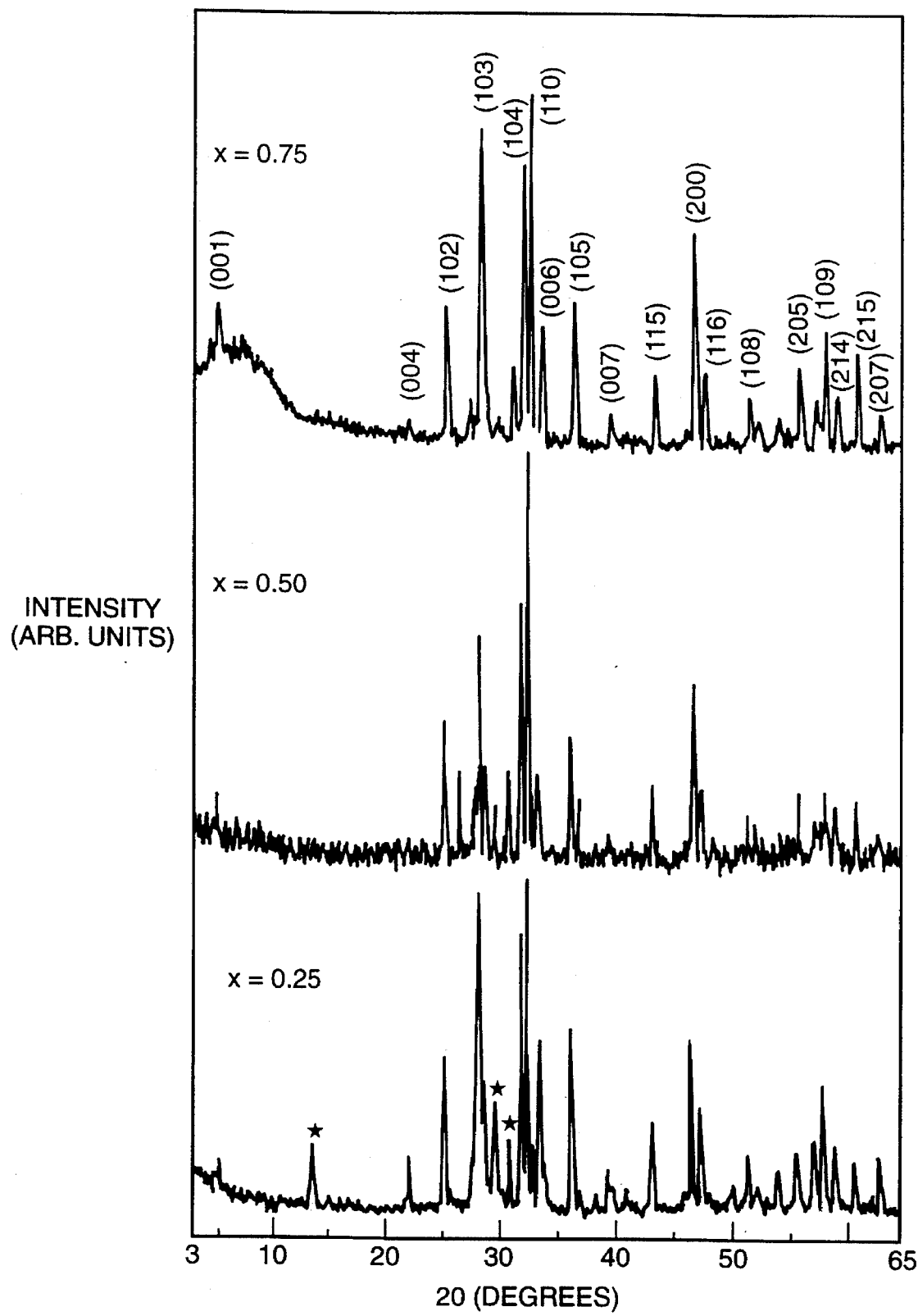
FIG. 1 is a set of x-ray powder diffraction patterns of an as-synthesized sample of $Hg_{1-x}Tl_xBa_2(Ca_{1-y}Sr_y)_2Cu_3O_{8+\delta}$.

The inventors of the present invention have endeavored to develop a thermally stable superconductor which also has a high critical temperature and a high critical current density. Thus, by reacting $Ba_2CuO_{3+x}$ and $Ca_{1-y}Sr_yCuO_2$, which have similar types of structures to the prepared superconductor, the present inventors have reduced the formation of a impure phase such as $CaHgO_2$ and prepared new mercury-thallium-based superconductors, with high reproducibility. And by substituting thallium for the a portion of the mercury, the present invention has been accomplished to prepare a new mercury-thallium-based superconductors which is thermally more stable and has higher critical current density than a prior art mercury-based superconductor.

The objective of the present invention is to provide new mercury-thallium-based superconductors and their preparing method, characterized in that the new superconductor is thermally stable and has a high critical temperature and a high critical current density.

Hereinafter, the present invention is described in particular.

The present invention relates to a superconductor with the formula $Hg_{1-x}Tl_xBa_2(Ca_{1-y}Sr_y)_2Cu_3O_{8+\delta}$ (0.1<x<0.9, 0.1<y<0.2).

The present invention relates to a mercury-thallium-based superconductor which is prepared by reacting ternary oxides such as $Ba_2CuO_{3+x}$ and $Ca_{1-y}Sr_yCuO_2$, to prevent the formation of an impure phase, and by substituting thallium for a portion of mercury, to thermally stabilize the superconductor and to provide it with a high critical temperature and a high critical current density. In preparing $Hg_{1-x}Tl_xBa_2(Ca_{1-y}Sr_y)_2Cu_3O_{8+\delta}$ and $Ca_{1-y}Sr_yCuO_2$ are similar to Hg, Tl-1223) of the present invention, the reactants $Ba_2CuO_{3+x}$ and $Ca_{1-y}Sr_yCuO_2$ are similar to Hg, Tl-1223 in their structures, were used, and thus easily form Hg, Tl-1223.

The method of the present invention may be described by formula (1), all the operations carried out in a dry box filled with argon to prevent contact with air.

Formula 1

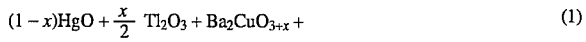

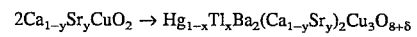

(1)

Stoichiometric amounts of HgO, $Tl_2O_3$, $Ba_2CuO_{3+x}$ and $Ca_{1-y}Sr_yCuO_2$ are mixed well in powder and pressed into pellets, which are then placed in an alumina tube. The alumina tube is put into a quartz tube and sealed to provide an ampule. The quartz ample is slowly heated up to 860°–880° C. and sintered at that temperature for 10–20 hours, and then slowly cooled. The sintered pellets are annealed at 300°–400° C. for 6–10 hours in argon atmosphere to prepare the Hg, Tl-1223 of the present invention.

According to known the method for preparing mercury-based superconductors, the respective oxides are formed into pellets. On the contrary, according to the present invention, the reactants are ternary oxides, so as to reduce the formation of impure phase $CaHgO_2$ and also to obtain reproducible synthesis of the products.

The present invention is described in more particular by following examples, but is not limited thereto.

EXAMPLE 1 preparation of $Hg_{0.5}Tl_{0.5}Ba_2(Ca_{0.86}Sr_{0.14})_2Cu_3O_8$.

357.3 mg HgO, 376.8 mg $Tl_2O_3$, 1274.0 mg $Ba_2CuO_{3+x}$ and 939.0 mg $Ca_{1-y}Sr_yCuO_2$ are mixed and pressed into pellets, which are then placed in an alumina tube of 8 mm inner diameter (a product of MacDanel Company). The alumina tube is put into a quartz tube of 99.9%, 10 mm inner diameter, and sealed.

Figure 2:
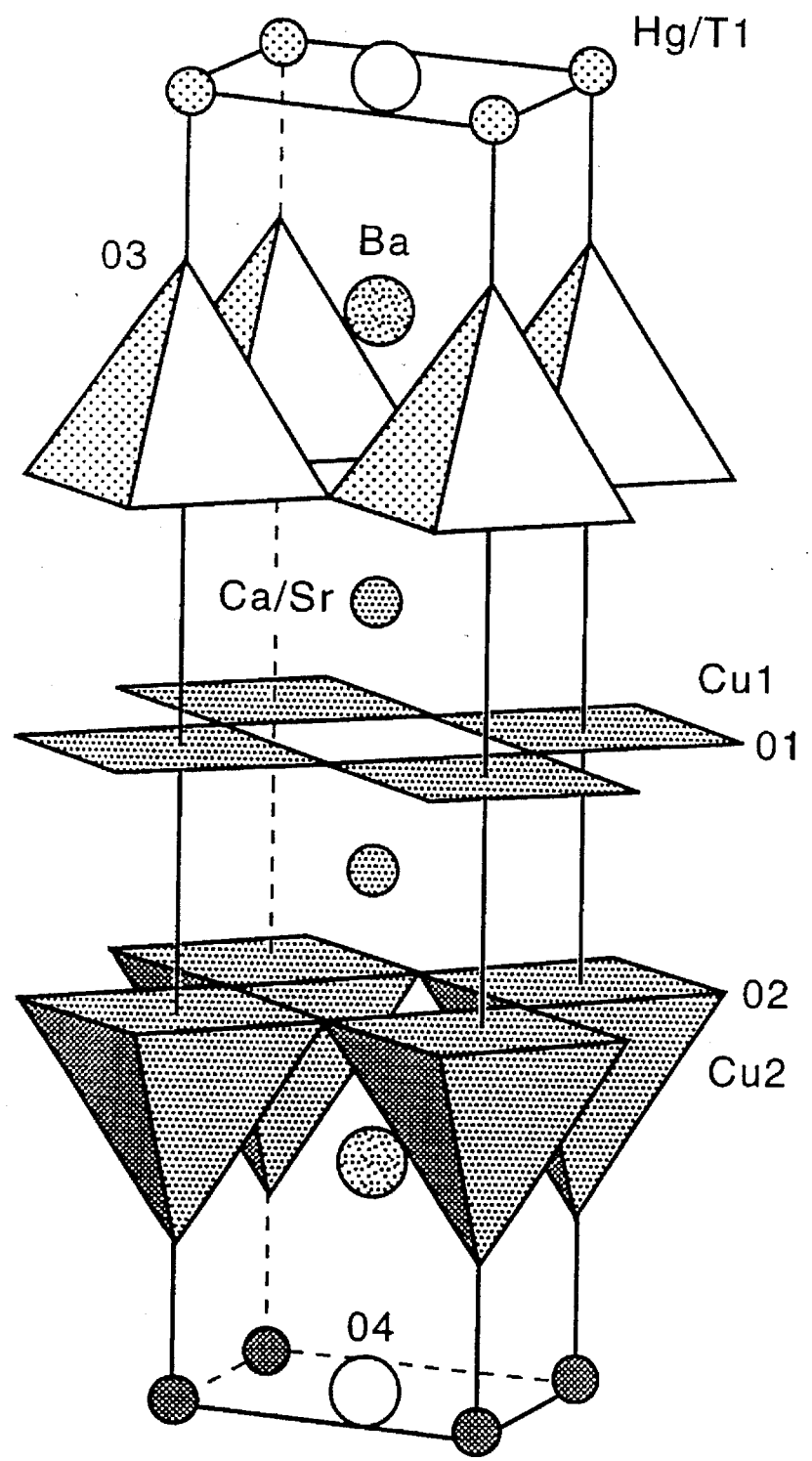
FIG. 2 is the schematic representation of the structure for $Hg_{1-x}Tl_xBa_2(Ca_{1-y}Sr_y)_2Cu_3O_{8+\delta}$.

The quartz ample is slowly heated up to 870° C., sintered at that temperature for 15 hours, and then slowly cooled. The sintered pellets are annealed at 400° C. for 8 hours in an argon atmosphere. The result of x-ray powder diffraction patterns is shown in FIG. 1. Most of the diffraction peaks are well indexed on space group P4/mmm with lattice parameters of a=3.8649Å and c=15.9573Å. As seen in FIG. 2, the prepared Hg, Tl-1223 has the same structure as known Hg-1223, and its critical temperature is about 132K.

EXAMPLE 2 preparation of $Hg_{0.75}Tl_{0.25}Ba_2(Ca_{0.86}Sr_{0.14})_2Cu_3O_8$.

Hg, Tl-1223 (x=0.25) is prepared according to the same method as in Example 1, except that 536.1 mg HgO, 188.4 mg $Tl_2O_3$, 1274.0 mg $Ba_2CuO_{3+x}$ and 939.0 mg $Ca_{1-y}Sr_yCuO_2$ are used.

EXAMPLE 3 preparation of $Hg_{0.25}Tl_{0.75}Ba_2(Ca_{0.86}Sr_{0.14})_2Cu_3O_8$.

Hg, Tl-1223 (x=0.75) is prepared according to the same method as in Example 1, except that 565.2 mg HgO, 178.7 mg $Tl_2O_3$, 1274.0 mg $Ba_2CuO_{3+x}$ and 939.0 mg $Ca_{1-y}Sr_yCuO_2$ are used.

COMPARATIVE EXAMPLE 1

Hg, Tl-1223 (x=0.25) is prepared according to the same method as in Example 1. The critical temperature of the resulting Hg, Tl-1223 is 128K.

COMPARATIVE EXAMPLE 2

Hg, Tl-1223 (x=0.75) is prepared according to the same method as in Example 1.

The critical temperature of the resulting Hg, Tl-1223 is 126K.

Figure 3:
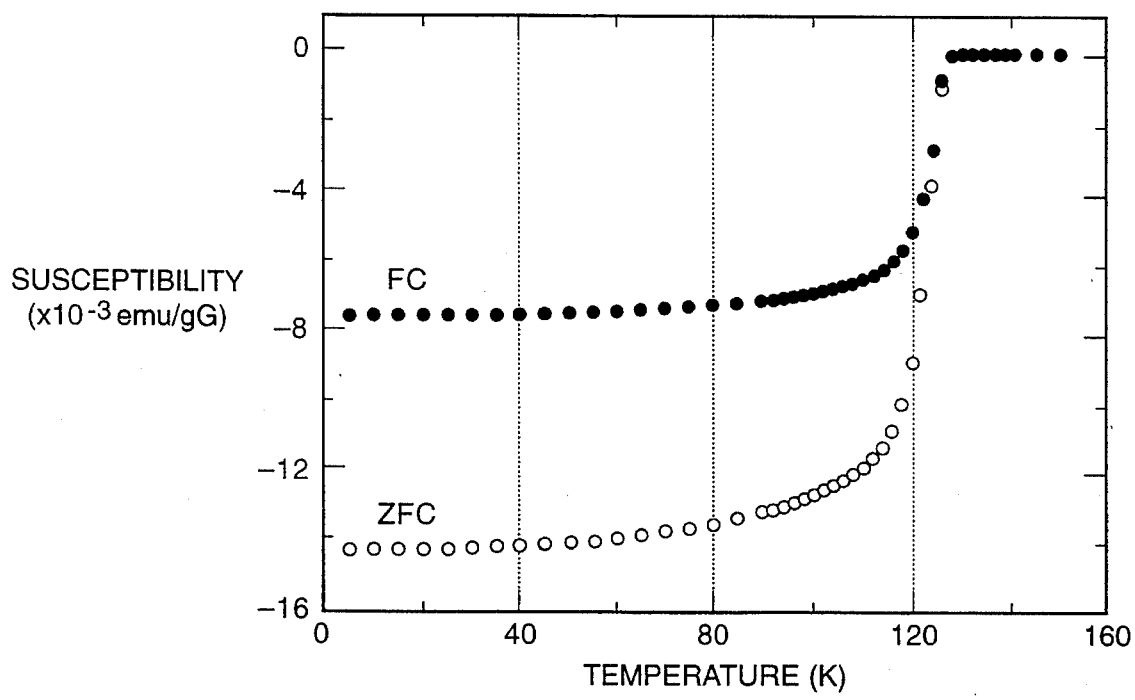
FIG. 3 illustrates the zero-field-cooled (ZFC) and field-cooled (FC) magnetic susceptibility of $Hg_{1-x}Tl_xBa_2(Ca_{1-y}Sr_y)_2Cu_3O_{8+\delta}$ (x=0.50) as a function of temperature.

The effects of the present invention are described with reference to FIGS. 3 to 5, as follows:

FIG. 3 displays the temperature dependence of the magnetic susceptibility for Hg, Tl-1223. It can be seen that Hg, Tl-1223 of the present invention is a superconductor with a Tc of 128K.

Figure 4:
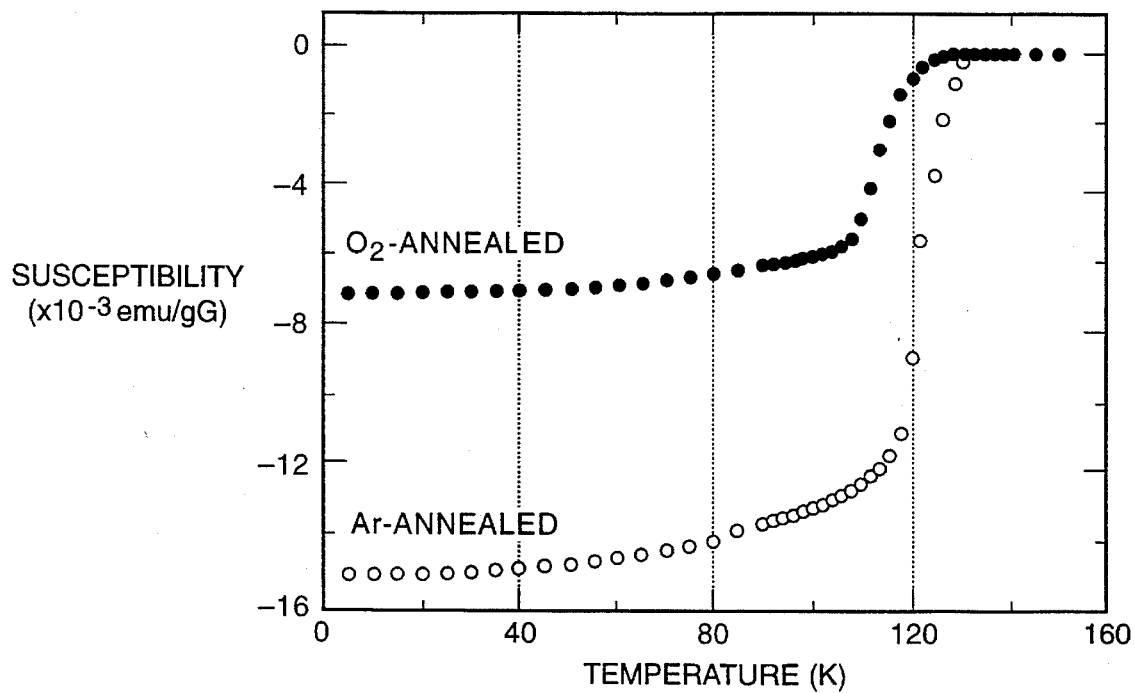
FIG. 4 illustrates magnetic susceptibilities of argon and oxygen annealed $Hg_{1-x}Tl_xBa_2(Ca_{1-y}Sr_y)_2Cu_3O_{8+\delta}$ (x→0.50) as a function of temperature.
Figure 5:
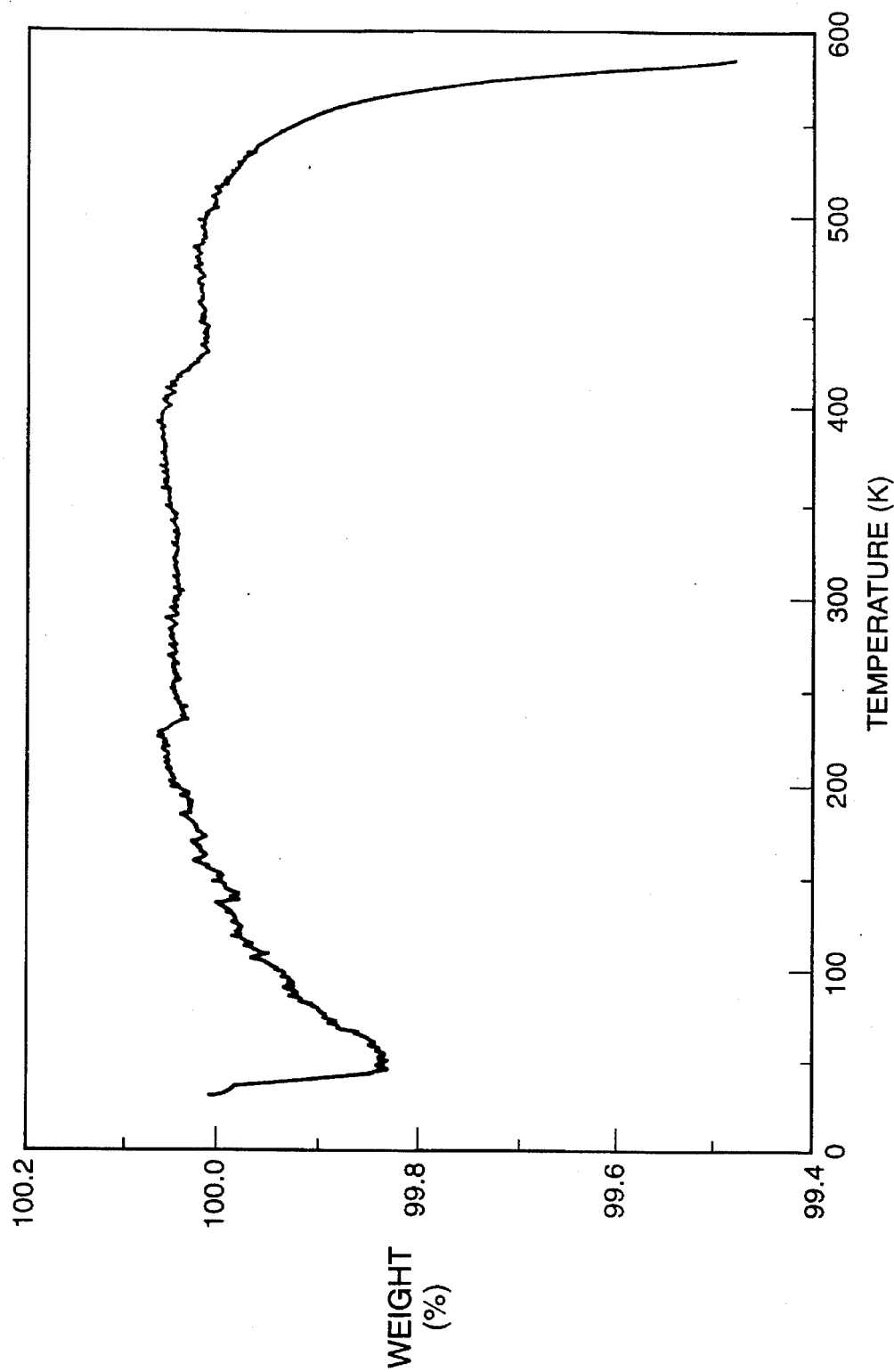
FIG. 5 illustrates thermogravimetric analysis of $Hg_{1-x}Tl_xBa_2(Ca_{1-y}Sr_y)_2Cu_3O_{8+\delta}$ (x=0.50) as a function of temperature.

FIG. 4 displays the temperature dependence of the magnetic susceptibility for Hg, Tl-1223. It can be seen that the Tc of Hg, Tl-1223 increases to 132K after argon-annealing FIG. 5 displays thermogravimetric analysis of Hg, Tl-1223 as a function of temperature, showing that a stable phase is maintained up to 500° C. without evaporation of mercury.

Figure 6:
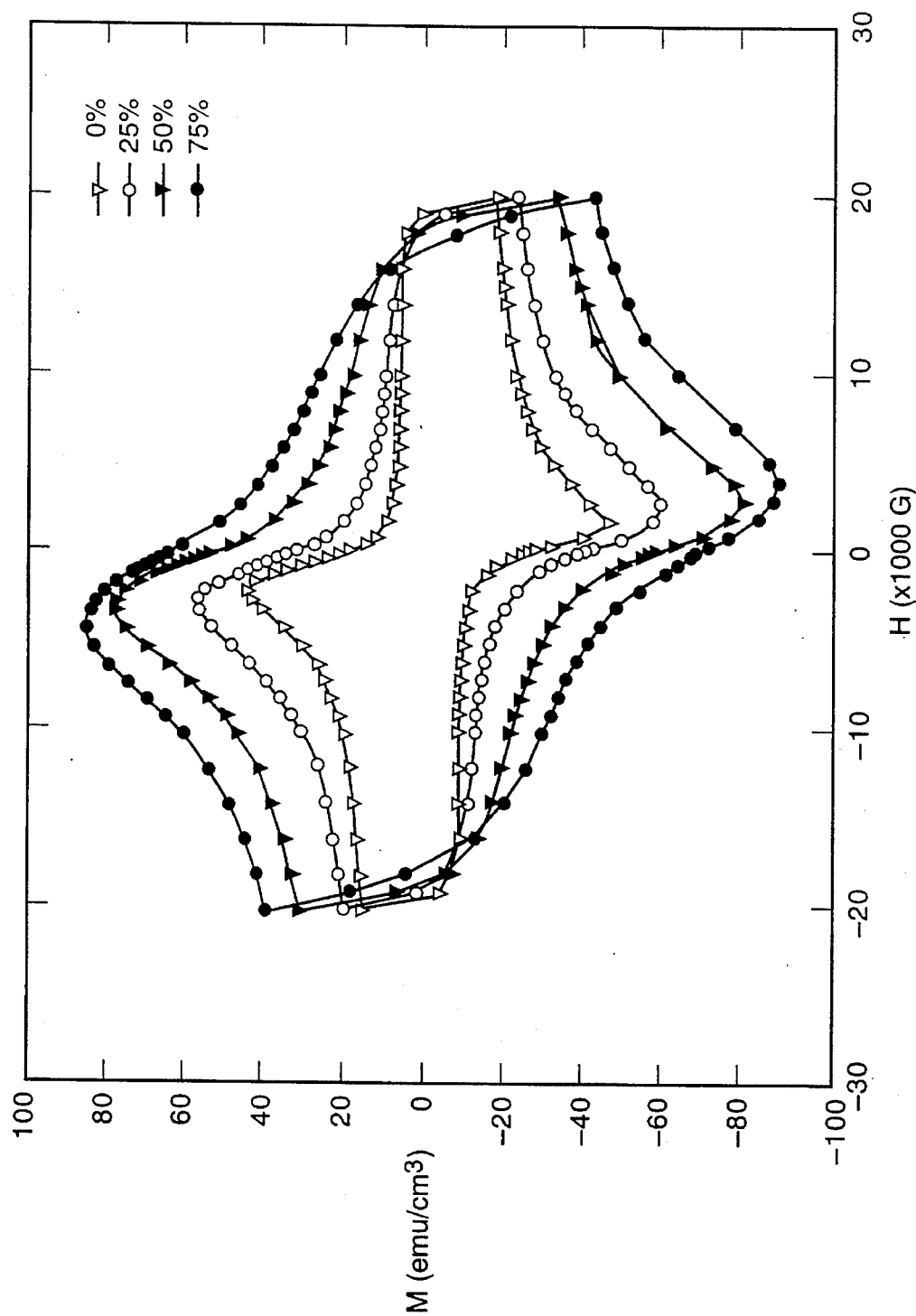
FIG. 6 shows a comparison of magnetic hysteresis loops at 10K for $Hg_{1-x}Tl_xBa_2(Ca_{1-y}Sr_y)_2Cu_3O_{8+\delta}$ of the present invention and $HgBa_2(Ca_{1-y}Sr_y)_2Cu_3O_{8+\delta}$.

FIG. 6 displays the magnetic hysteresis loops for Hg, Tl-1223 of the present invention and $HgBa_2(Ca_{1-y}Sr_y)_2Cu_3O_{8+\delta}$ of a prior art superconductors. It can be seen that Hg, Tl-1223 has a much higher critical current density than a prior mercury-based superconductor.

Therefore, Hg, Tl-1223 of the present invention is thermally more stable than a prior mercury-based superconductor, a higher critical current density and also has a high Tc of 132K. Its preparing method is easy, with high reproducibility.

What is claimed is:

1. A mercury-thallium-based superconductor with the formula:

$$Hg_{1-x}Tl_xBa_2(Ca_{1-y}Sr_y)_2Cu_3O_{8+\delta}$$

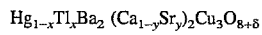

wherein x is from about 0.25 to about 0.75 and y is greater than 0.1 and less than 0.2.

2. A method of preparing a mercury-thallium-based superconductor with the formula:

$$Hg_{1-x}Tl_xBa_2(Ca_{1-y}Sr_y)_2Cu_3O_{8+\delta}$$

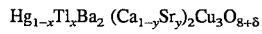

wherein x is from about 0.25 to about 0.75 and y is greater than 0.1 and less than 0.2, said method comprising the steps of:

mixing HgO, $Tl_2O_3$, $Ba_2CuO_{3+x}$ and $Ca_{1-y}Sr_yCuO_2$ in powder form;

pressing the resulting powder mixture into pellets;

placing said pellets in an alumina tube;

putting said alumina tube containing said pellets into a quartz tube;

sealing said quartz tube to create an ampule;

sintering said pellets in said ampule at 860°~880° C.; and annealing the resulting sintered pellets at 300°~400° C. in an argon atmosphere.

* * * * *

UNITED STATES PATENT AND TRADEMARK OFFICE
CERTIFICATE OF CORRECTION

PATENT NO.   : 5,492,885

DATED        : February 20, 1996

INVENTOR(S)  : HUR et al.

It is certified that error appears in the above-identified patent and that said Letters Patent is hereby corrected as shown below:

On the title page:

Item [75], correct the first inventor's name to read --Nam Hwi Hur--.

Signed and Sealed this

Eighteenth Day of June, 1996

Attest:

BRUCE LEHMAN

*Attesting Officer*   *Commissioner of Patents and Trademarks*